United States Patent
Cheng et al.

(10) Patent No.: US 10,394,126 B2
(45) Date of Patent: Aug. 27, 2019

(54) PHOTOLITHOGRAPHY PROCESS AND MATERIALS

(71) Applicant: Taiwan Semiconductor Manufacturing Company, Ltd., Hsin-Chu (TW)

(72) Inventors: Ya-Ling Cheng, Yilan County (TW); Ching-Yu Chang, Hsin-Chu (TW); Chien-Wei Wang, Hsinchu County (TW); Yen-Hao Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 634 days.

(21) Appl. No.: 14/802,756

(22) Filed: Jul. 17, 2015

(65) Prior Publication Data
US 2017/0017158 A1   Jan. 19, 2017

(51) Int. Cl.
| G03F 7/20 | (2006.01) |
| G03F 7/32 | (2006.01) |
| G03F 7/38 | (2006.01) |
| G03F 7/40 | (2006.01) |

(52) U.S. Cl.
CPC ............ G03F 7/32 (2013.01); G03F 7/322 (2013.01); G03F 7/38 (2013.01); G03F 7/405 (2013.01)

(58) Field of Classification Search
CPC ... G03F 7/32; G03F 7/38; G03F 7/322; G03F 7/405; G03F 7/265
See application file for complete search history.

(56) References Cited

U.S. PATENT DOCUMENTS

| 6,017,683 | A | * | 1/2000 | Endo ..................... G03F 7/0045 430/313 |
| 8,216,767 | B2 | | 7/2012 | Wang et al. |
| 8,323,870 | B2 | | 12/2012 | Lee et al. |
| 8,580,117 | B2 | | 11/2013 | Kao et al. |
| 8,658,344 | B2 | | 2/2014 | Wang et al. |
| 8,715,919 | B2 | | 5/2014 | Chang et al. |
| 8,741,551 | B2 | | 6/2014 | Wu et al. |
| 2009/0306243 | A1 | * | 12/2009 | Kakutani ............... G03F 7/027 522/170 |
| 2013/0183450 | A1 | * | 7/2013 | Bernard .................... B05B 1/02 427/402 |

(Continued)

FOREIGN PATENT DOCUMENTS

| CN | 101676801 A | 3/2009 |
| EP | 2420890 A1 | 2/2012 |

(Continued)

OTHER PUBLICATIONS

Office Action dated Aug. 19, 2016 for corresponding Patent Application No. 10-2015-0168938 issued by Korean Intellecutal Property Office Aug. 19, 2016.

*Primary Examiner* — Brittany L Raymond
(74) *Attorney, Agent, or Firm* — Haynes and Boone, LLP

(57) ABSTRACT

One of the broader forms of the present disclosure relates to a method of making a semiconductor device. The method includes exposing a photoresist layer to a radiation source and applying a hardening agent to the photoresist layer. Therefore after applying the hardening agent a first portion of the photoresist layer has a higher glass transition temperature, higher mechanical strength, than a second portion of the photoresist layer.

17 Claims, 16 Drawing Sheets

(56) References Cited

U.S. PATENT DOCUMENTS

| | | | |
|---|---|---|---|
| 2013/0203898 A1* | 8/2013 | Mueller-Cristadoro | C08G 59/10 523/466 |
| 2013/0323641 A1 | 12/2013 | Chang | |
| 2014/0011133 A1 | 1/2014 | Liu et al. | |
| 2014/0017615 A1 | 1/2014 | Chang | |
| 2014/0017616 A1 | 1/2014 | Chang | |
| 2014/0065843 A1 | 3/2014 | Chang et al. | |
| 2014/0117563 A1 | 5/2014 | Yu et al. | |
| 2014/0120459 A1 | 5/2014 | Liu et al. | |
| 2014/0186773 A1 | 7/2014 | Chang | |
| 2014/0220495 A1* | 8/2014 | Bozano | G03F 7/0392 430/325 |
| 2014/0255850 A1 | 9/2014 | Chang et al. | |
| 2014/0272709 A1 | 9/2014 | Liu et al. | |
| 2014/0272726 A1 | 9/2014 | Chang | |
| 2014/0273521 A1 | 9/2014 | Wu et al. | |
| 2016/0320701 A1* | 11/2016 | Cheng | G03F 7/40 |

FOREIGN PATENT DOCUMENTS

| | | |
|---|---|---|
| JP | 2013539201 | 10/2013 |
| KR | 1020110011585 | 2/2011 |
| TW | 200949463 | 12/2009 |
| TW | 201405244 | 2/2014 |

\* cited by examiner $R_{fl} \text{—} (P)_y$
FIG. 4B
$R_{fl} \text{—} (L)_z$
FIG. 4C
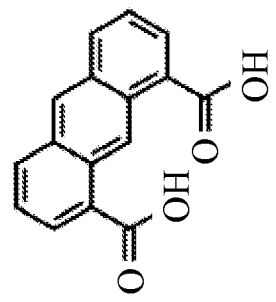
FIG. 4D
FIG. 4E
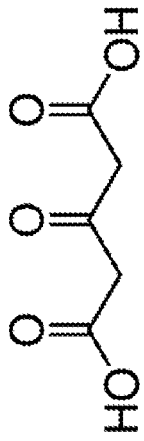
FIG. 4F

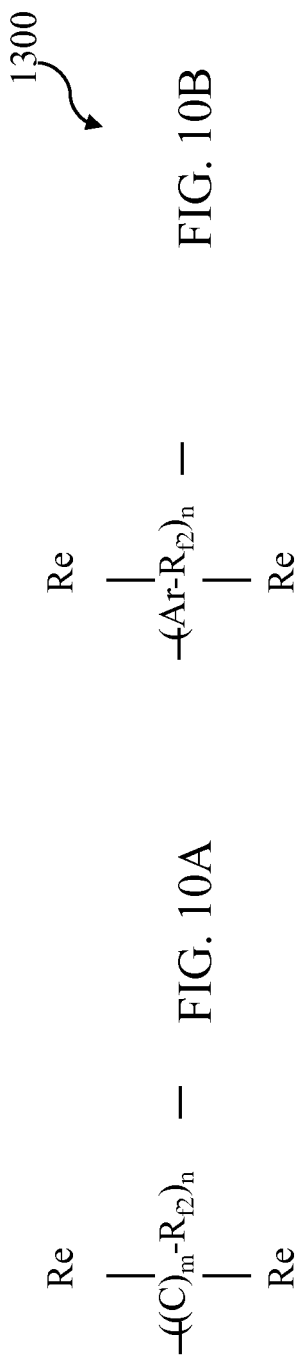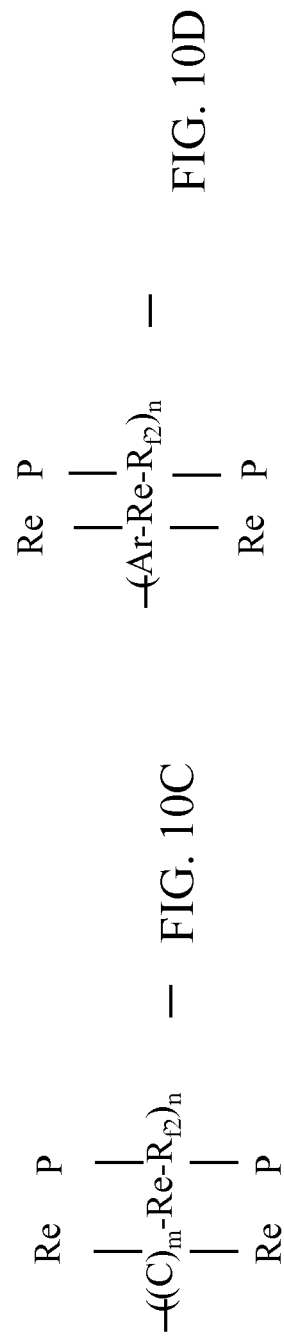
FIG. 10A  FIG. 10B
FIG. 10C  FIG. 10D

PHOTOLITHOGRAPHY PROCESS AND MATERIALS

BACKGROUND

The semiconductor integrated circuit (IC) industry has experienced rapid growth in the past several decades. Technological advances in semiconductor materials and design have produced increasingly smaller and more complex circuits. These material and design advances have been made possible as the technologies related to processing and manufacturing have also undergone technical advances. As a size of the smallest component has decreased, challenges rise to reduce pattern collapsing, pattern peeling and thickness loss.

BRIEF DESCRIPTION OF THE DRAWINGS

Aspects of the present disclosure are best understood from the following detailed description when read in association with the accompanying figures. It is noted that, in accordance with the standard practice in the industry, various features in the drawings are not drawn to scale. In fact, the dimensions of illustrated features may be arbitrarily increased or decreased for clarity of discussion.

FIGS. 4B, 4C, 4D, 4E and 4F illustrate a hardening agent constructed in accordance with some embodiments.

FIGS. 10A, 10B, 10C and 10D illustrate a smoothing agent constructed in accordance with some embodiments.

DETAILED DESCRIPTION

Figure 1:
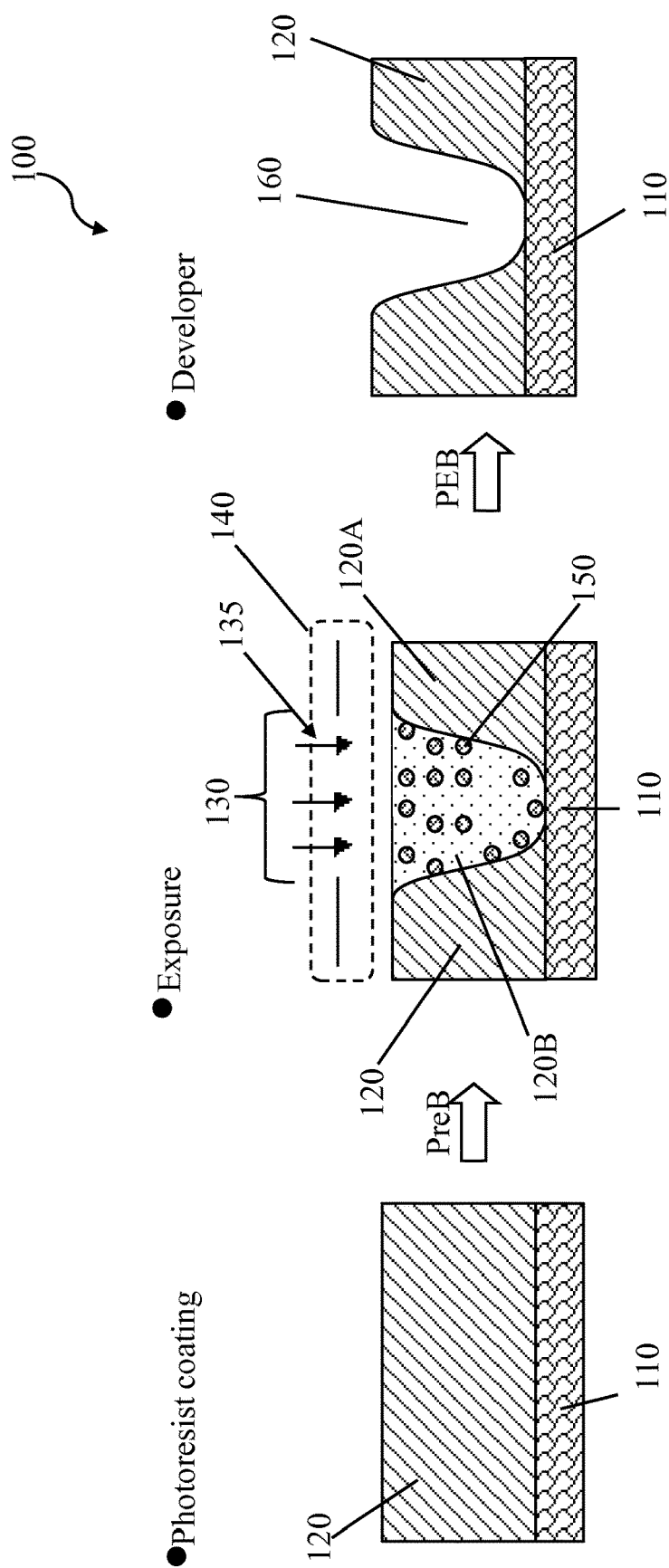
FIG. 1 is a diagram showing an illustrative photo-resist exposure process, according to one example of principles described herein.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present disclosure provides a lithography method for manufacturing a semiconductor device. The terms lithography, immersion lithography, photolithography and optical lithography may be used interchangeably in the present disclosure. Photolithography is a process used in microfabrication, such as semiconductor fabrication, to selectively remove parts of a thin film or a substrate. The process uses light to transfer a pattern (e.g., a geometric pattern) from a photomask to a light-sensitive layer (e.g., photoresist, or simply "resist") on the substrate. The light causes a chemical change in exposed regions of the light-sensitive layer, which may increase or decrease solubility of the exposed regions. If the exposed regions become more soluble, the light-sensitive layer is referred to as a positive photoresist. If the exposed regions become less soluble, the light-sensitive layer is referred to as a negative photoresist. Baking processes may be performed before or after exposing the substrate, such as a post-exposure baking process. A developing process selectively removes the exposed or unexposed regions with a developing solution creating an exposure pattern over the substrate. A series of chemical treatments may then engrave/etch the exposure pattern into the substrate (or material layer), while the patterned photoresist protects regions of the underlying substrate (or material layer). Alternatively, metal deposition, ion implantation, or other processes can be carried out. Finally, an appropriate reagent removes (or strips) the remaining photoresist and the substrate are ready for the whole process to be repeated for the next stage of circuit fabrication. In a complex integrated circuit (for example, a modern CMOS), a substrate may go through the photolithographic cycle a number of times.

FIG. 1 is a diagram showing an illustrative photoresist exposure process 100. The process 100 involves coating a photoresist layer 120 over a substrate 110. In some embodiments, the substrate 110 includes silicon. The substrate 110 may alternatively or additionally include other suitable semiconductor material, such as germanium (Ge), silicon germanium (SiGe), silicon carbide (SiC), gallium arsenic (GaAs), diamond, indium arsenide (InAs), indium phosphide (InP), silicon germanium carbide (SiGeC), and gallium indium phosphide (GaInP). The substrate 110 may also include various features such as various doped regions, shallow trench isolation (STI) regions, source/drain features, gate stacks, dielectric features, and/or multilevel interconnects.

The photoresist layer 120 is then exposed to a radiation beam 135 from a light source 130, through a photomask (mask or reticle) 140. The photomask 140 has a predefined pattern. The exposure process will result in a photoresist pattern that includes a plurality of exposed regions such as exposed features and a plurality of unexposed regions. FIG. 1 illustrates the photoresist layer 120 in varying shades. Region 120A illustrates a region that was blocked from the light source 130 and thus no acid was created therein. By contrast, region 120B represents a region that was exposed to light thereby causing an acid creating chemical reaction within the region 120B. The light source 130 may be a variety of sources, including a deep ultra-violet (DUV) source. In one example, the light source 130 may be an extreme ultraviolet (EUV) light source. In some examples, other light sources 130 such as electron beam (e-beam) writing. Alternatively, the exposure process may utilize other radiation beams, such as ion beam, x-ray, and other proper exposure energy. Additionally, a pre-bake of the photoresist 120 may be performed prior to the exposure process in order to cure and dry the photoresist 120.

During exposure, the solubility of the photoresist layer 120 is increased when photoresist layer 120 is a positive tone photoresist (i.e., the acid will cleave an acid cleavable polymer, resulting in the polymer becoming more hydrophilic). Alternatively, the solubility of photoresist layer 120 is decreased when photoresist layer 120 is a negative tone photoresist (i.e., the acid will catalyze an acid catalyzed crosslinkable polymer, resulting in the polymer becoming more hydrophobic). Additionally, the photoresist layer 120 may be subjected to a post-exposure bake (PEB) and then developed by any suitable process to form a pattern in the photoresist layer 120.

Subsequently, a developing solution may be utilized to remove portions of the photoresist layer 120. The developing solution may remove the exposed or unexposed portions depending on the resist type (e.g. positive or negative tone). If the photoresist layer 120 comprises a negative-type resist, the exposed portions are not dissolved by the developing solution and remain over the substrate. If the photoresist layer 120 is a positive-type resist, the exposed portions are dissolved by a positive-tone developing solution, leaving the unexposed portions behind. If the photoresist layer 120 is a positive-type resist being developed by a negative-tone developing solution then the unexposed portions would be dissolved, leaving the exposed portions. The remaining exposed portions (or unexposed portions) define a pattern.

Although existing methods of lithography have been generally adequate for their intended purposes, they have not been entirely satisfactory in all respects. For example, when the photoresist layer 120 includes an alkali aqueous soluble component such as a hydroxyl group (e.g. —OH) or a carboxylic acid group (e.g. —COOH), the unexposed pattern partially dissolves when developed by a developer. This issued is referred to as swelling and causes poor line-width-variation, film loss and photoresist pattern collision. The present disclosure provides lithography process with a hardening treatment to reduce poor line-width-variation, film loss and photoresist pattern collision.

Figure 2:
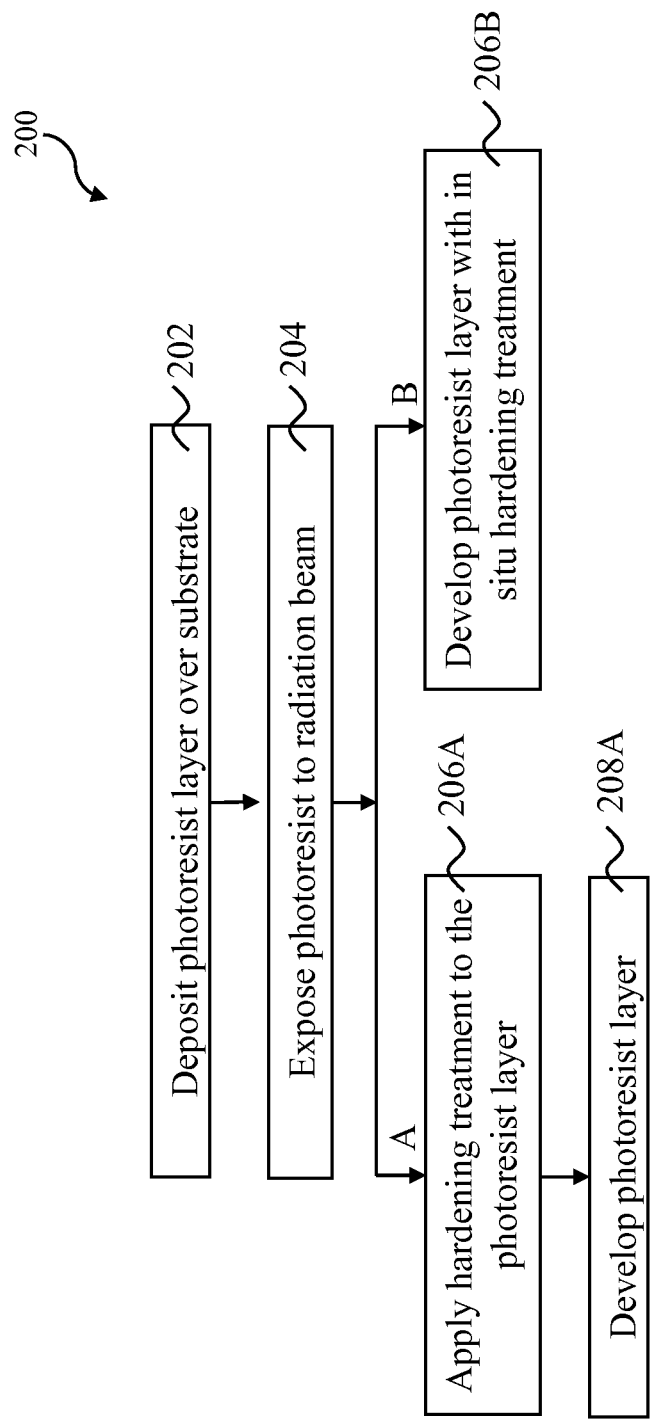
FIG. 2 is a flowchart of a method for making a semiconductor device in an exemplary embodiment according to various aspects of the present disclosure.

FIG. 2 illustrates a flowchart of a method 200 of making a semiconductor device 300 according to aspects of the present disclosure, constructed in accordance with some embodiments. The present disclosure repeats reference numerals and/or letters in the various embodiments. This repetition is for the purpose of simplicity and clarity such that repeated reference numerals and/or letters indicate similar features amongst the various embodiments unless stated otherwise.

Figure 3:
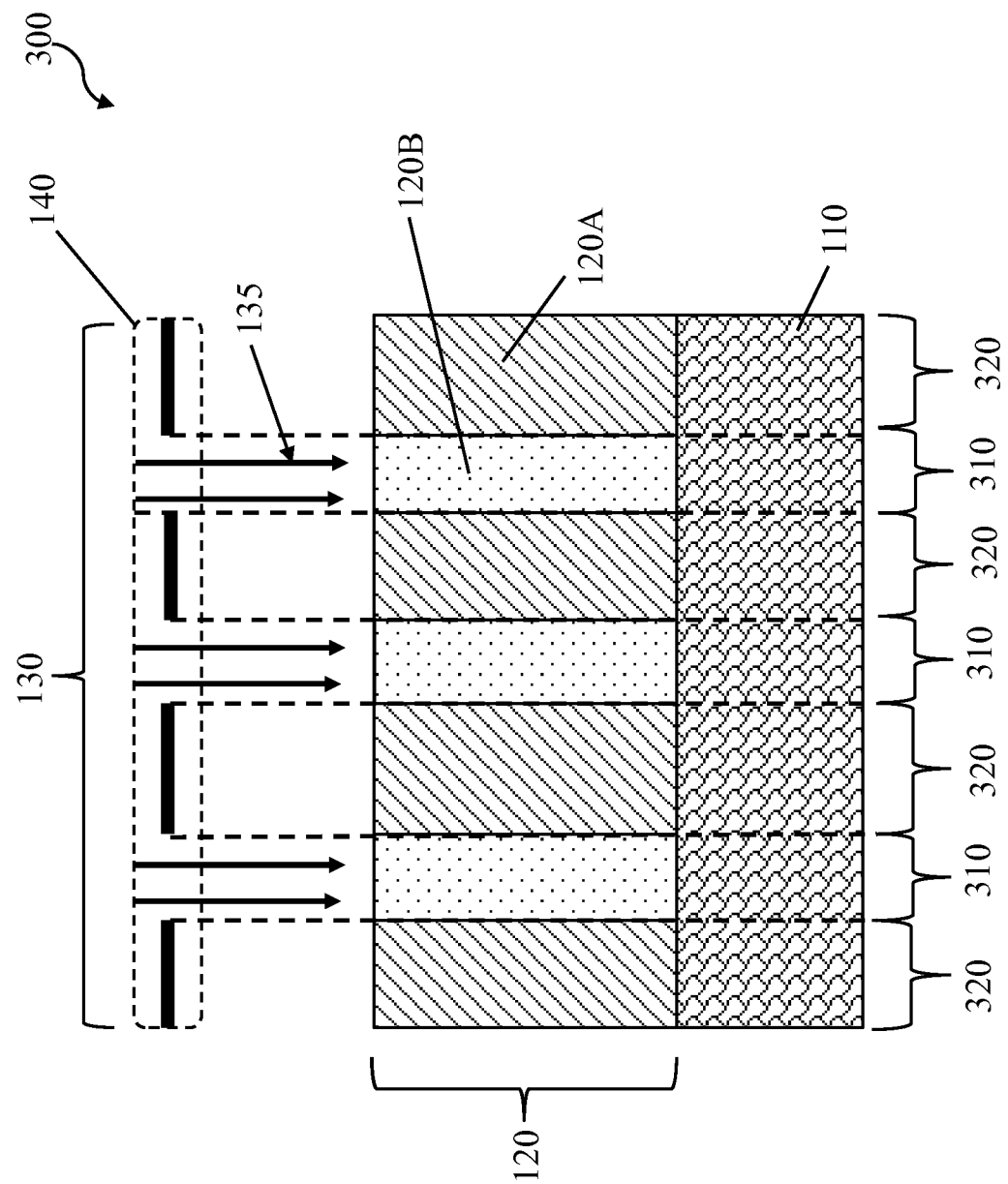
FIGS. 3 and 4A are cross-sectional views of a semiconductor device at various fabrication stages constructed in accordance with the method of FIG. 2.

Referring to FIGS. 2 and 3, the method 200 starts at step 202 by depositing a photo-sensitive layer, such as photoresist layer 120, over the substrate 110, such as using a spin-coating technique. The method 200 then proceeds to step 204 by exposing the photoresist layer 120 to a radiation source. The photoresist layer 120 is exposed to a radiation beam (such as the radiation beam 135) from a light source (such as the light source 130), through the photomask (mask or reticle) 140 having a predefined pattern. The exposure process forms a latent image (or pattern) in the photoresist layer 120 that includes a plurality of exposed regions 310 and a plurality of unexposed regions 320. FIG. 3 illustrates the photoresist layer 120 in varying shades. The darker color region 120B represents the exposed region 310, causing an acid creating chemical reaction, while the lighter color regions 120A illustrate unexposed regions 320, which are blocked from the light source 130 and thus no acid was created. In the exposed region 310, the radiation beam 135 reaches to the photoresist 120 to create an effective solubility switch between exposed and unexposed regions, 310 and 320.

Figure 4A:
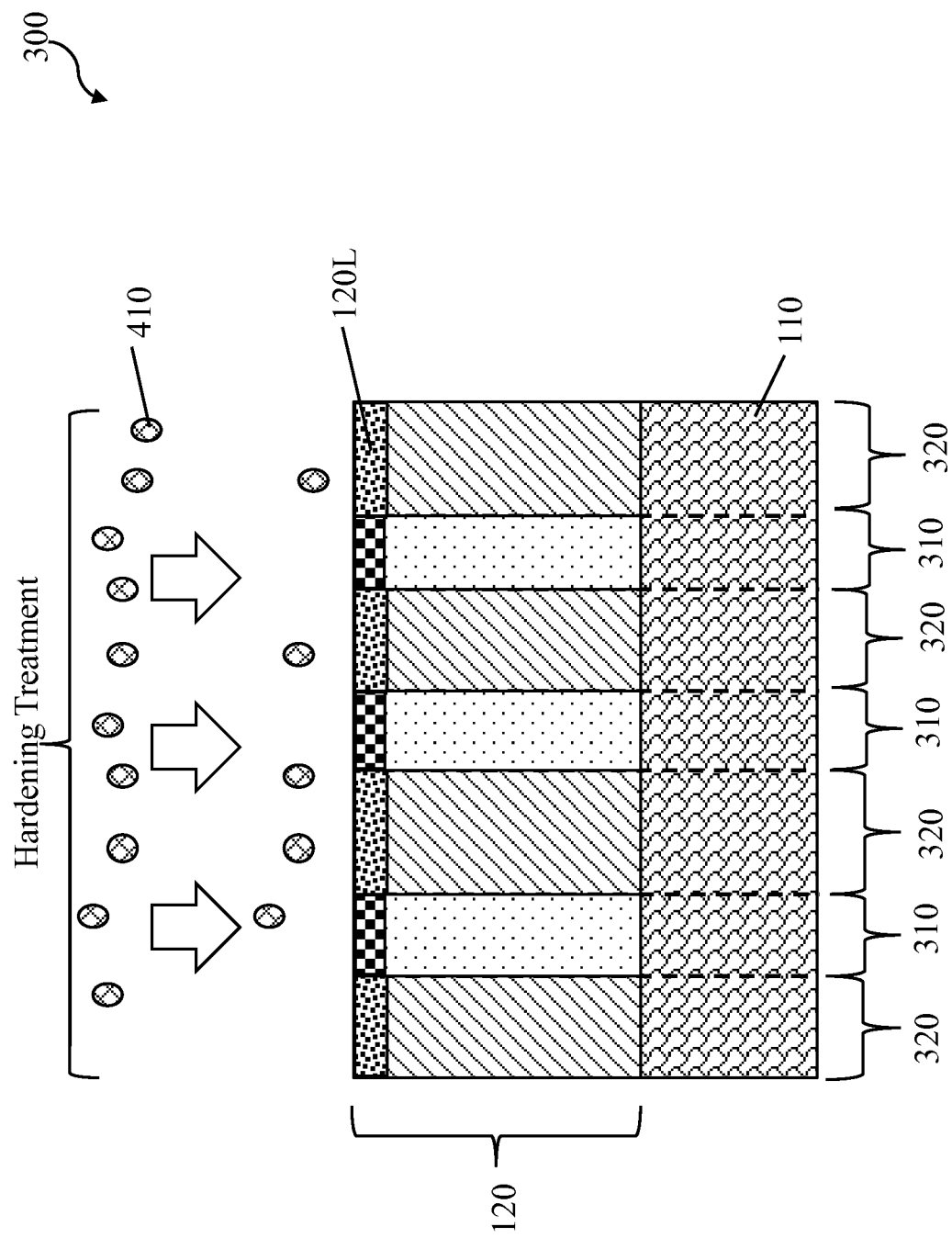

The method 200 has two paths after step 204, identified by the suffix "A" and "B," respectively. These two paths are separately discussed below. Referring to FIGS. 2 and 4A, for the path A, the method 200 proceeds to step 206A by applying a hardening treatment with a hardening agent 410 to the photoresist layer 120. The hardening treatment may include a wet-treatment with aqueous solutions mixing with the hardening agent 410, performed in a wet process station or in a chamber. A concentration of the hardening agent 410 is in a range of about 0.1% to about 50% of the aqueous solutions.

During the hardening treatment, the hardening agent 410 reacts with a top portion of the photoresist layer 120. Specifically, the hardening agent reacts with the top portion of photoresist layer 120 to increase increases surface density, the glass transition temperature (Tg), or mechanical strength, of the top portion to thereby form a hardened top layer 120L. Therefore, the hardened top layer 120L has a higher glass transition temperature than a second portion of the photoresist layer positioned directly under the hardened top layer 120L.

In one example, the hardening agent 410 has a chemical structure shown in FIG. 4B, which includes at least a first spacer group $R_{f1}$ in between the brackets. The first spacer group $R_{f1}$ may include aromatic carbon ring, or straight or cyclic alkyl, alkoxyl, fluoroalkyl, fluoroalkoxyl, alkene, alkyne, hydroxyl, ketone, aldehyde, carbonate, carboxylic acid, ester, ether, amide, amine, imine, imide, azide, nitrate, nitrile, nitrite or thiol spacer group with the chain carbon 1~12. The first spacer group $R_{f1}$ links with polar groups $(P)_y$, where y is an integer at least two. The polar group P may include —Cl, —Br, —I, —NO$_2$, —SO$_3$—, —H—, —CN, —NCO, —OCN, —CO$_2$—, —OH, —OR*, —OC(O)CR*, —SR, —SO$_2$N(R*)$_2$, —SO$_2$R*, SOR, —OC(O)R*, —C(O)OR*; —C(O)R*; —Si(OR*)$_3$; —Si(R*)$_3$; epoxyl groups, where R* is H, an unbranched or branched, cyclic or noncyclic saturated or unsaturated alkyl or alkenyl or alkynyl groups.

In another example, the hardening agent 410 has another chemical structure shown in FIG. 4C, which includes the first spacer group $R_{f1}$ in between the brackets, linking with link groups (L)z, where z is an integer at least two. The link group L may include —NH$_2$, —OH, —SH, —COOH, —COH—COOR, OCOR, COR anhydride, epoxy group, en group, R'OR, R'OOR, R'OSOOR, RX, here R* is H, an unbranched or branched, cyclic or noncyclic saturated or unsaturated alkyl or alkenyl or alkynyl groups. X is a halide.

The hardening agent 410 may also include a surfactant. In some embodiment, a concentration of surfactant is in a range of about 0.1% to about 10% of the aqueous solution.

The hardening agent 410 may also include a solvent or aqueous solution. In some embodiment, a concentration of the hardening agent 410 is about from 0.1% to 50% of the solvent.

Specific examples of a hardening agent 410 can include, but not limited to anthracene-1, 8-dicarboxylic acid, di-ethanolamine and acetone-1, 3-dicarboxylic acid, ethylenediamine, shown in FIGS. 4D-4F, respectively. Other forms of the hardening agent 410 may be used in accordance with principles described herein.

In some embodiments, the polar group $(P)_y$ of the hardening agent 410 is absorbed by, or reacts to, developable functional groups (such as —OH or —COOH) of the top portion of the photoresist layer 120 to form the hardened outer layer 120L. In some embodiments, the hardened top layer 120L is formed by inter molecular force, such as van der waals force, hydrogen bonding, electronic force and ionic force, between the hardening agent 410 and the top portion of the photoresist layer 120. For example, when the polar group $(P)_y$ contains hydroxyl groups while the photoresist layer 120 surface contains carboxylic acid groups, the hydroxyl units tend to be absorbed by the carboxylic acid groups due to strong hydrogen bonding between each other.

In some embodiments, the hardened top layer 120L is formed by covalent bonding formation, such as alkylation, condensation, carboxylation, esterification and/or amidation. For example, when the link group $(L)_z$ contains hydroxyl groups while the photoresist layer 120 contains phenol groups, hydroxyl groups tend to react with phenol groups to form covalent bonding between the hardening agent 410 and the outer layer of the photoresist layer 120.

Figure 5:
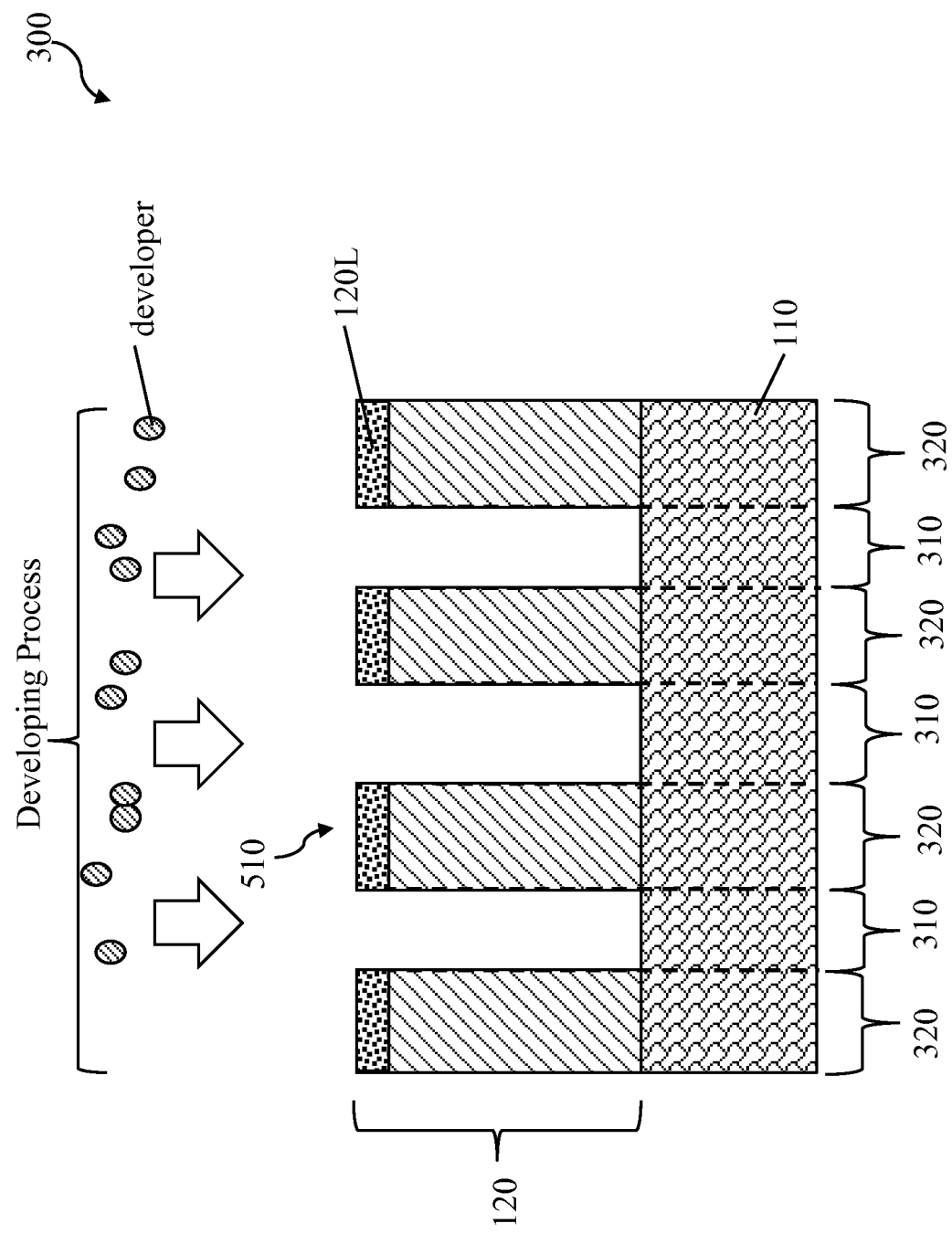
FIGS. 5, 6A and 6B are cross-sectional views of a semiconductor device at various fabrication stages constructed in accordance with the method of FIG. 2.

Referring to FIGS. 2 and 5, continuing along path A the method 200 proceeds to step 208A by developing the photoresist layer 120 having the hardened top layer 120L to form photoresist features 510. A developing solution may be utilized to remove portions of the photoresist layer 120. An example of a developing solution is tetramethylammonium hydroxide (TMAH). Any concentration level of TMAH developer solution may be utilized, such as approximately 2.38% TMAH developer solution. The developing solution may remove the exposed or unexposed portions depending on the resist type. For example, if the photoresist layer 120 comprises a negative-type resist, the exposed portions are not dissolved by the developing solution and remain over the substrate 110. If the photoresist layer 120 includes a positive-type resist, the exposed portions are dissolved by the developing solution, leaving the unexposed portions behind. The semiconductor device 300 may then be subjected to a rinsing process, such as a de-ionized (DI) water rinse. The rinsing process may remove residue particles. Additionally, prior to developing the photoresist layer 120, a post-exposure bake (PEB) is performed.

During the developing process, the hardened top layer 120L slows down the developer (such as TMAH) from attacking the photoresist layer 120. Because the hardened top layer 120L slows down the development of photoresist layer 120, less film is lost and less line-width-variation occurs during the formation of the photoresist features 510.

Figure 6A:
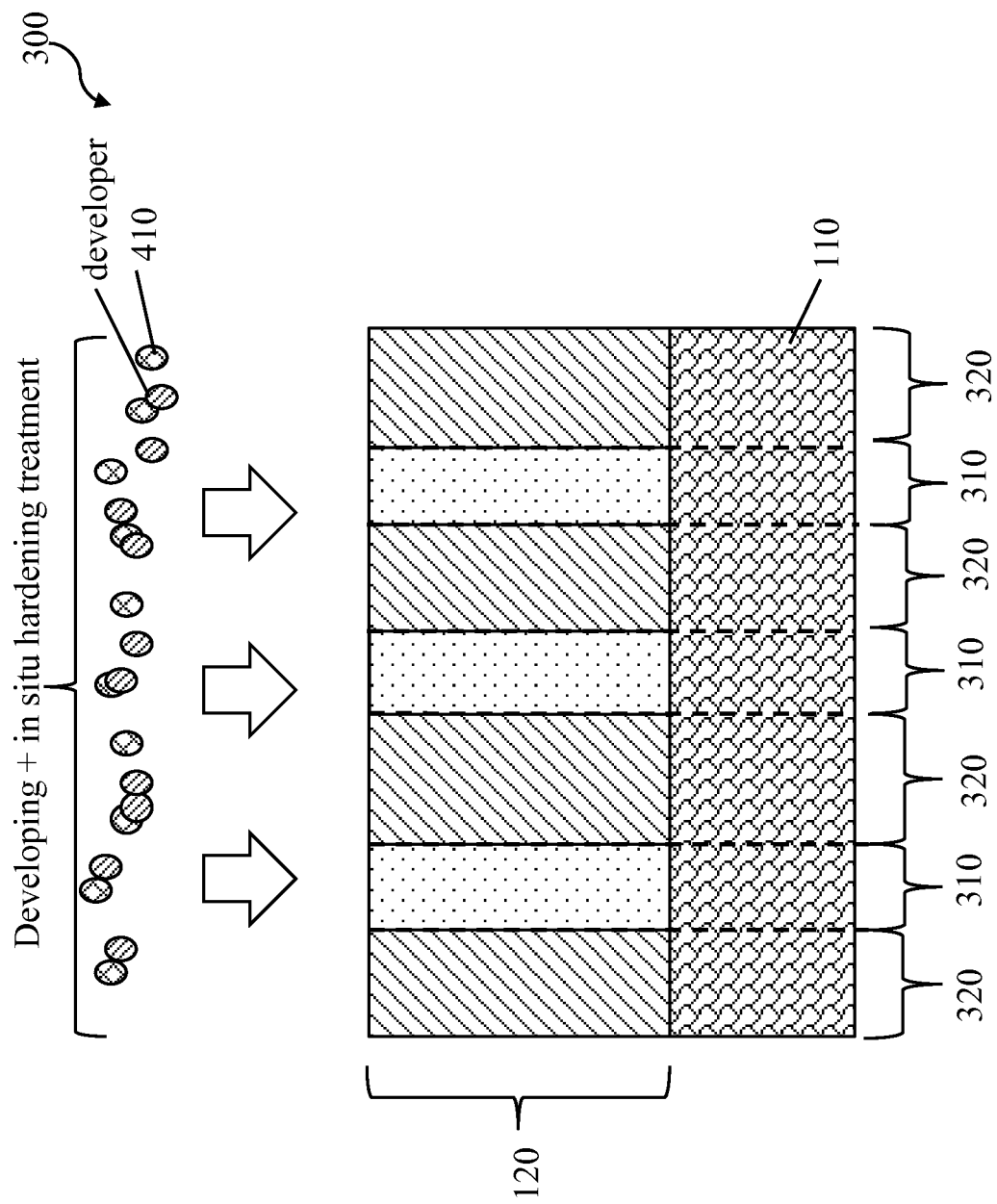
Figure 6B:
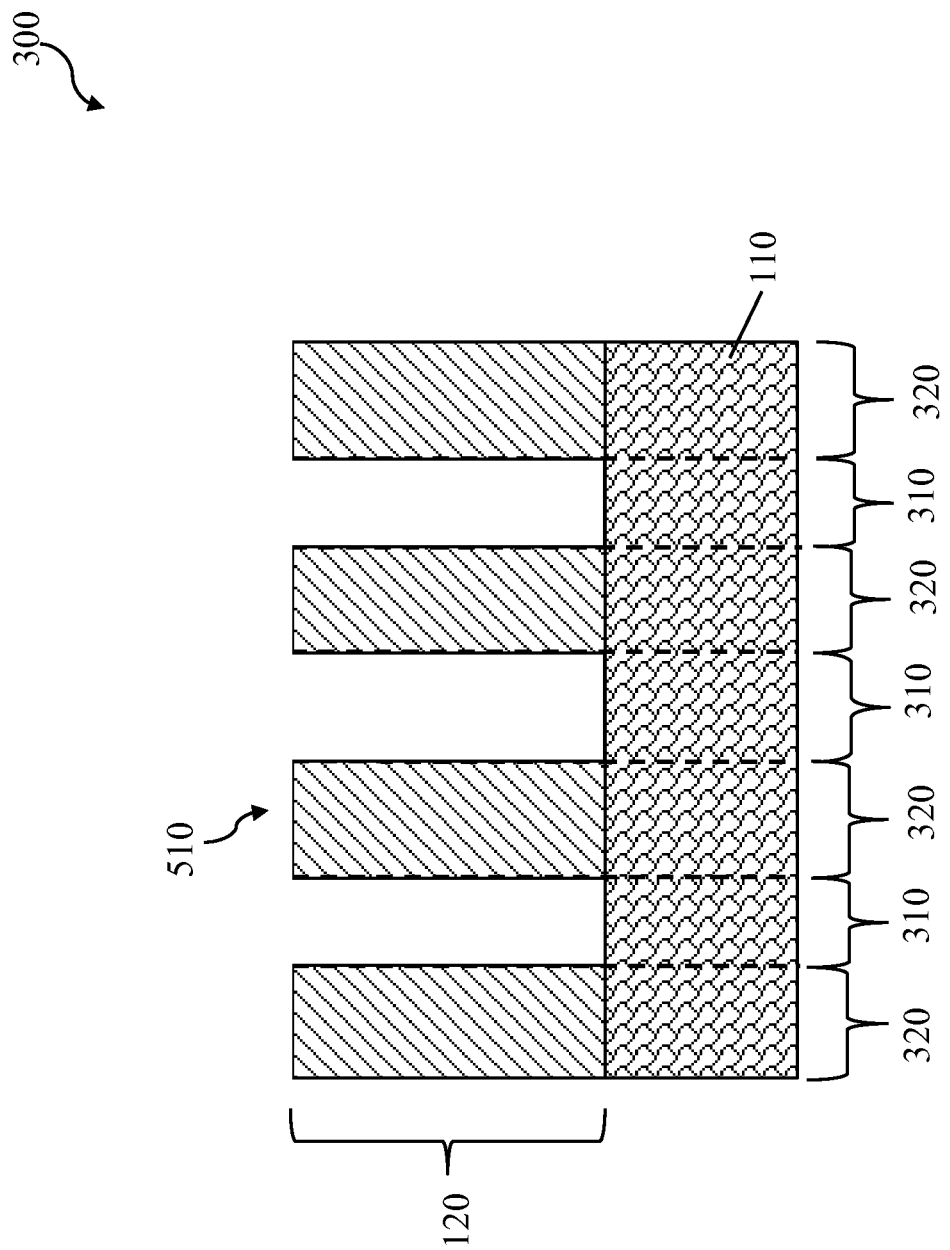

As discussed above, method 200 has two paths after step 204, identified by the suffix "A" and "B", respectively. Now turning to path B, referring to FIGS. 2 and 6A-6B, the method 200 proceeds to step 206B by developing the photoresist layer 120 with an in situ hardening treatment with the hardening agent 410 to form the photoresist features 510. The in situ hardening treatment may include incorporating the hardening agent 410 into the developing solution such as by blending. That is, under path B there is no separate application of the hardening agent 410 prior to developing the photoresist layer 120. Instead, the hardening agent 410 is part of the developing solution being applied to the photoresist layer 420.

During the developing process, the hardening agent 410 is absorbed by and/or reacts to the photoresist layer 120, which is similar in many respects to those discussed above association with FIG. 4A. Equipped with multi-polar groups P, the hardening agent 410 is absorbed by and/or reacted to functional groups (e.g. —OH or —COOH) in the top layer of the photoresist layer 120. The hardening agent 410 slows down the developer solution's (such as TMAH) attack on the photoresist layer 120 by making a surface of the photoresist layer 120 have a lower affinity to developer. It results in increasing the mechanical strength of the photoresist feature 510 and thereby mitigates collapsing of the photoresist feature 510.

Additional steps may be implemented before, during, and after the method 200, and some steps described above may be replaced or eliminated for other embodiments of the method 200. For example, a curing process is performed after step 206A and prior to step 208A, for path A. The curing process may include an ultraviolet (UV) curing, a plasma curing, a radiation curing, baking, or any proper process.

Figure 7:
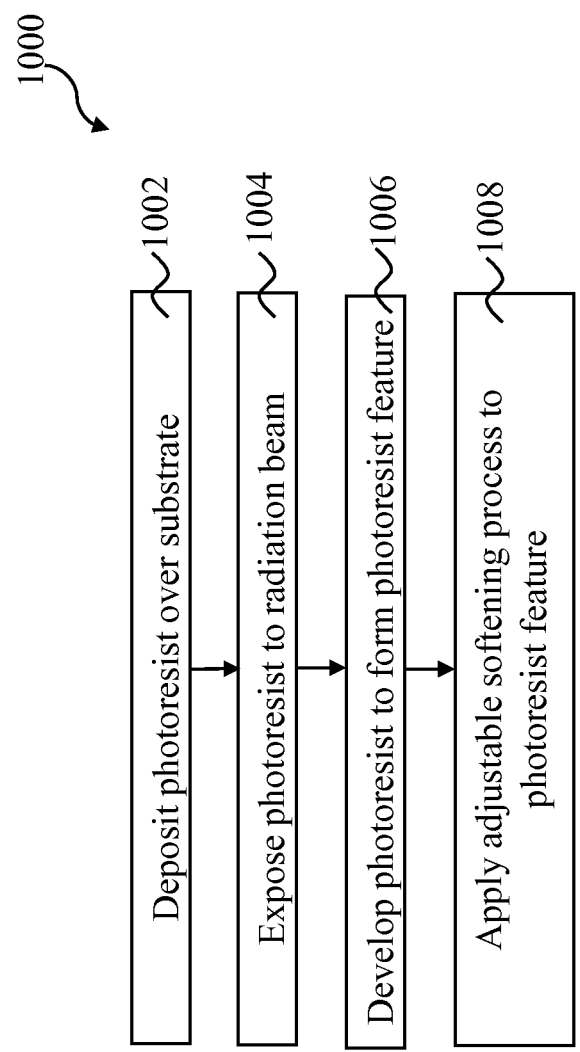
FIG. 7 is a flowchart of a method for making a semiconductor device in an exemplary embodiment according to various aspects of the present disclosure.

FIG. 7 is a flowchart of an example method 1000 for another lithography process of fabricating the semiconductor device 300. The present disclosure repeats reference numerals and/or letters in the various embodiments. This repetition is for the purpose of simplicity and clarity such that repeated reference numerals and/or letters indicate similar features amongst the various embodiments unless stated otherwise. Method 1000 begins with steps 1002 and 1004 which are similar to steps 202 and 204 of the method 200. For simplicity and clarity, the description above with respect to steps 202 and 204 is applicable for steps 1002 and 1004, respectively, and will not be repeated here again.

Figure 8A:
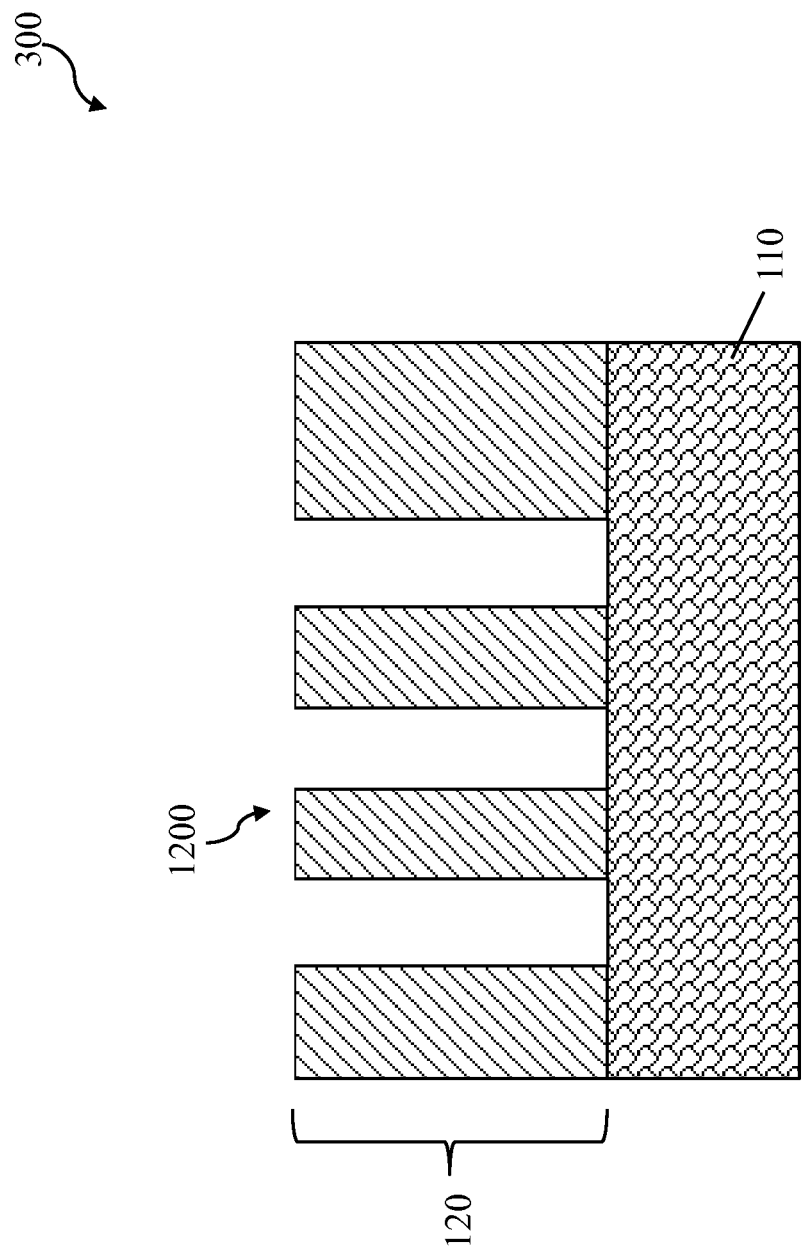
FIGS. 8A, 8B, 9A, 9B, 9C and 9D are cross-sectional views of a semiconductor device at various fabrication stages constructed in accordance with the method of FIG. 7.
Figure 8B:
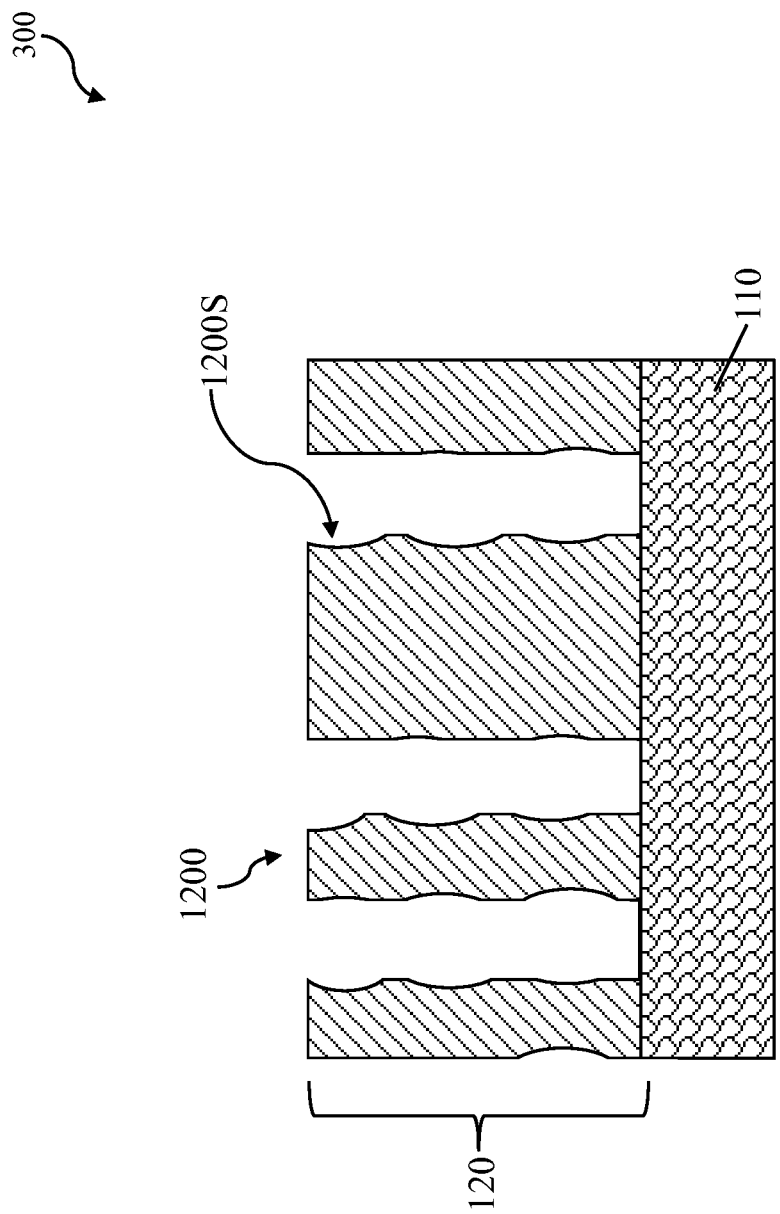

Next, referring to FIGS. 7 and 8A, method 1000 proceeds to step 1006 by developing the photoresists layer 120 to form photoresist features 1200. The developing process is similar in many respects to those discussed above in association with FIG. 5. As discussed above, photoresist layer 120 usually contains some alkali aqueous soluble groups such as a hydroxyl group (e.g. —OH) or a carboxylic acid group (e.g. —COOH). During the developing process, these alkali aqueous soluble groups sometimes caused unexposed portions of a pattern to be partial dissolved by developer (or swelled by the developer). This unintended partial dissolving (or swelling) of unexposed portions of photoresist layer 120 results in photoresist feature 1200 having a wave-like profile/sidewall 1200S, as show in FIG. 8B. The present disclosure provides a method with an adjustable smoothening process to reduce the degree of the wake-like profile of the photoresist feature 1200.

Figure 9A:
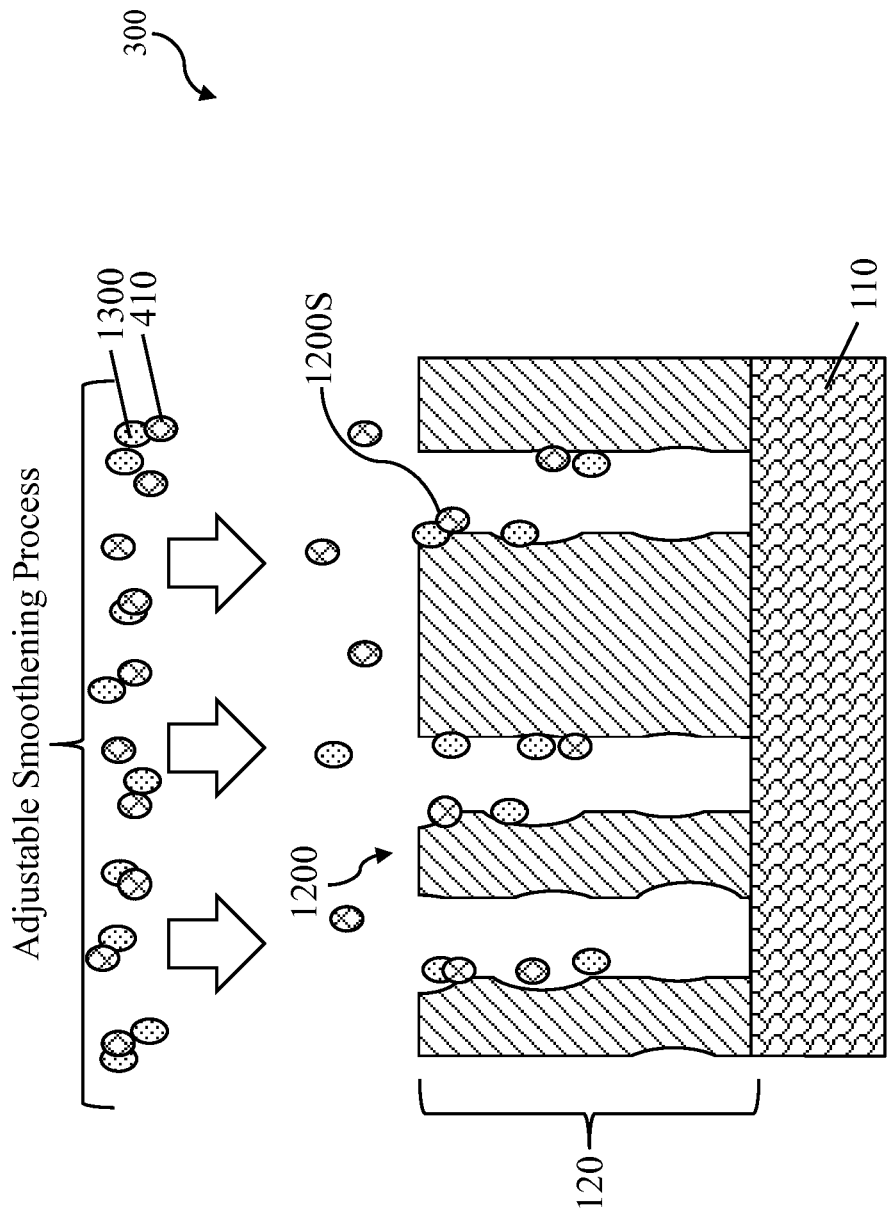
Figure 9B:
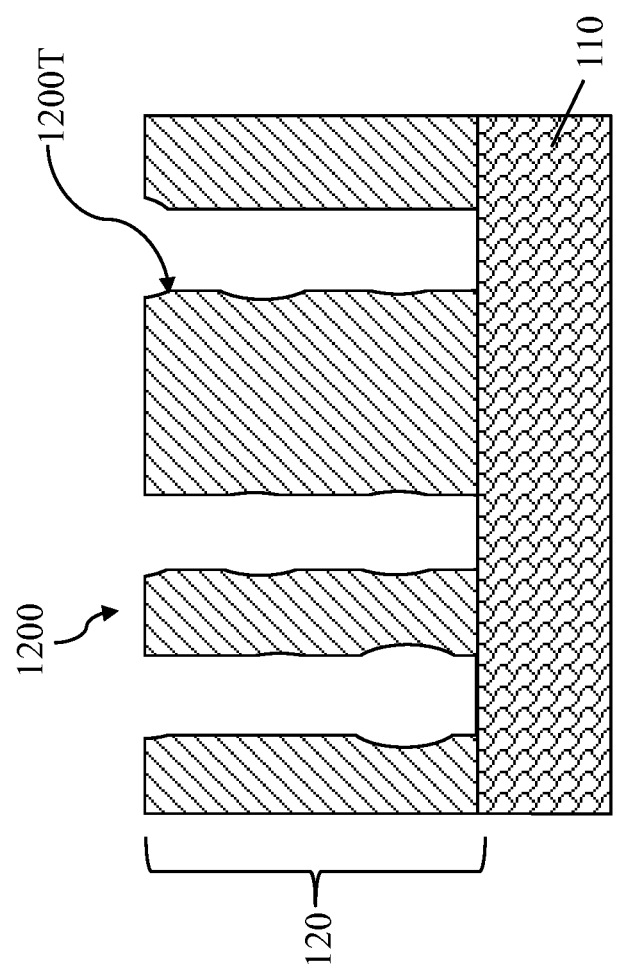

Referring to FIGS. 7 and 9A-9B, method 1000 proceeds to step 1008 by applying an adjustable smoothening process to the photoresist feature 1200 to reduce the degree of the wake-like profile. The adjustable smoothening process includes applying the hardening agent 410 and a smoothing agent 1300 to the photoresist feature 1200. In the present embodiment, the smoothing agent 1300 is chosen to decrease the glass transition temperature (Tg) of the photoresist layer 120 to soften the photoresist layer 120. This softening process smoothens the sidewall profile 1200S. Meanwhile, the hardening agent 410 increases the glass transition temperature (Tg), or mechanical strength, of the photoresist layer 120 to harden the photoresist layer 120 to prevent the photoresist feature 1200 collapsing.

With consideration of characteristics of the photoresist feature 1200, such as critical dimension and aspect ratio, a proper balance of the smoothing agent 1300 and the hardening agent 410 is chosen to achieve reducing the degree of wave-like sidewall profile to create a smoothened profile 1200T without the photoresist feature 1200 collapsing, as shown in FIG. 9B. In the present embodiment, the molecular weight of the smoothing agent 1300 is in a range from 150 dalton to 3000 dalton.

Figure 9C:
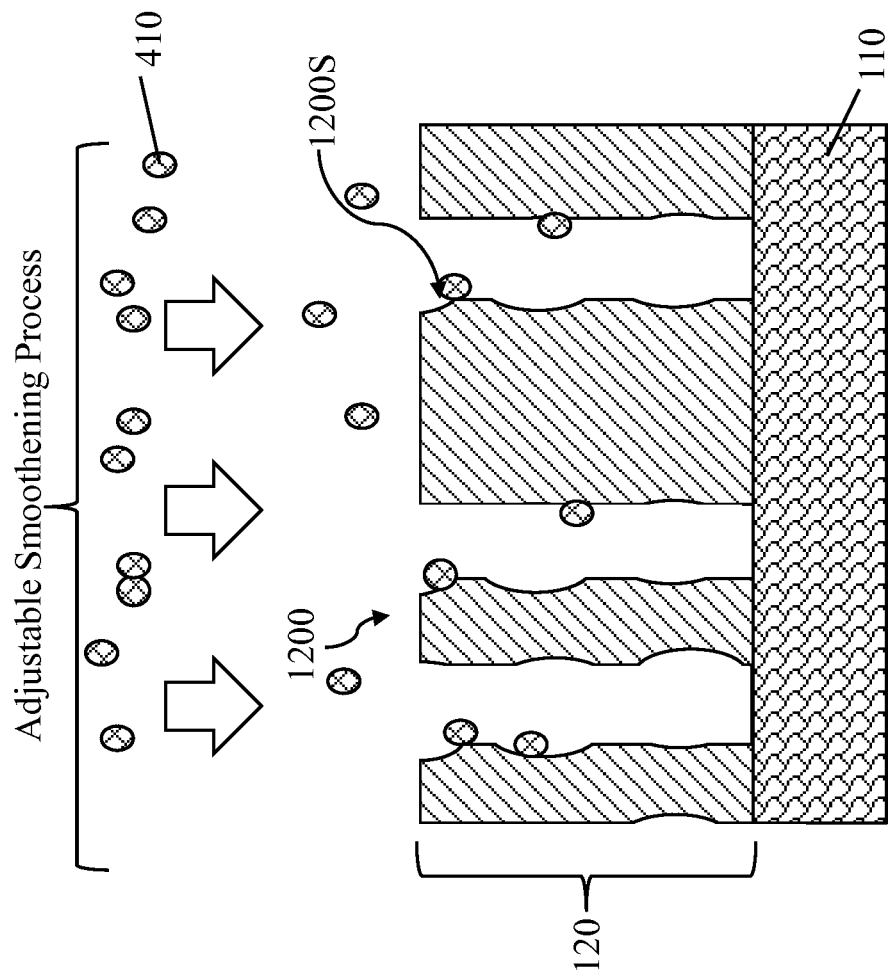
Figure 9D:
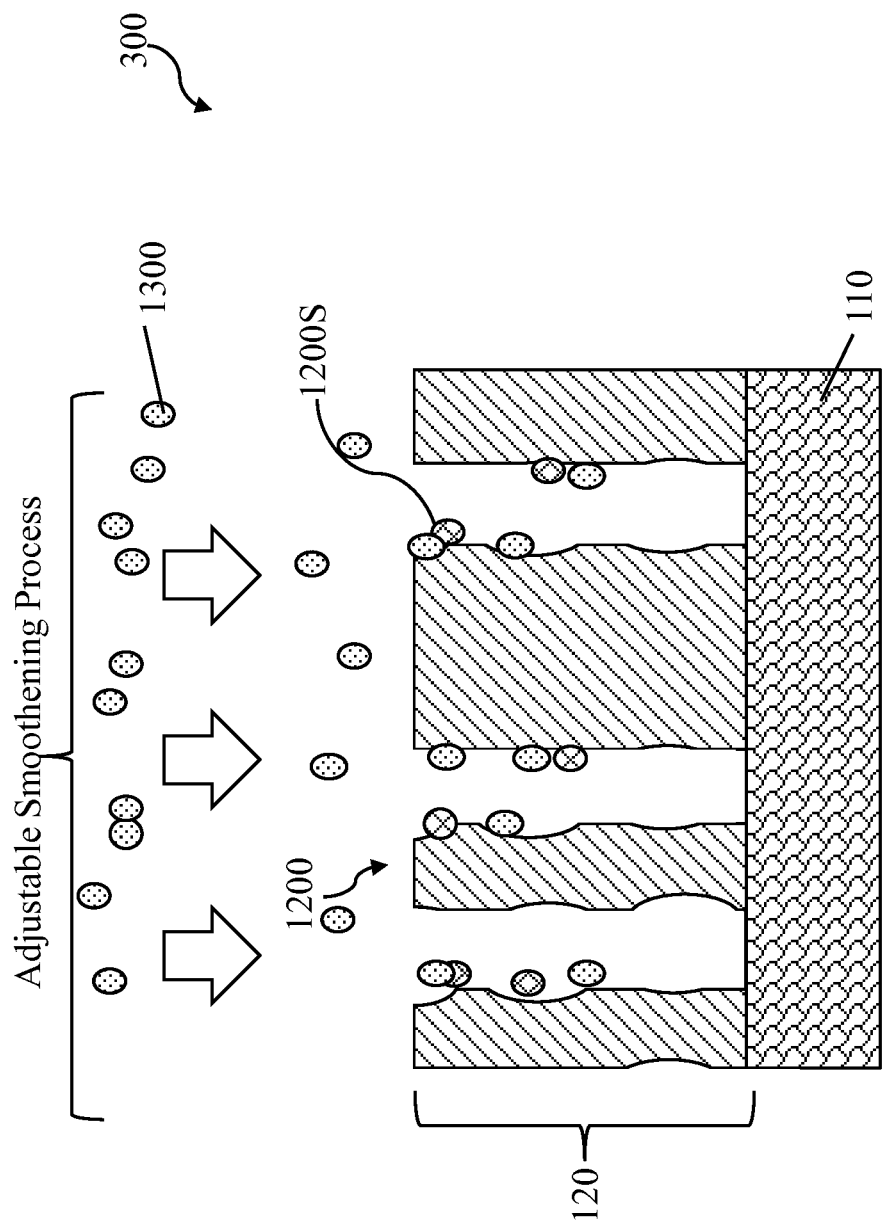

In some embodiments, the hardening agent 410 and the smoothing agent 1300 are applied to the photoresist features 1200 simultaneously, such as by blending them together, as shown in FIG. 9A. The hardening agent 410 is tended to absorb onto the photoresist layer 120 firstly due to its higher polar functional group P, which has higher affinity to a surface of the photoresist layer 120. In some embodiment, the hardening agent 410 and the smoothing agent 1300 are applied separately, such that the hardening agent 410 is applied to the photoresist features 1200 first and the smoothing agent 1300 is applied next, as shown in FIGS. 9C-9D. Both of hardened agent 410 and smoothing agent 1300 is then in situ removed during the adjustable smoothening process.

The smoothing agent 1300 has a general structure shown in FIG. 10A, which includes a second spacer group $R_{f2}$ links to a carbon included group $(C)_m$ in between the brackets. The second spacer group $R_{f2}$ has an aromatic carbon ring, or straight or cyclic alkyl/alkoxyl/fluoro alkyl fluoroalkoxyl chain with the chain carbon 1~4 or straight or cyclic alkene, alkyne, hydroxyl, ketone, aldehyde, carbonate, carboxylic acid, ester, ether, amide, amine, imine, imide, azide, nitrate, nitrile, nitrite or thiol spacer group with the chain carbon 1~4, —Cl, —Br, —I, —NO$_2$, —SO$_3$—, —H—, —CN, —NCO, —OCN, —CO$_2$—, —OH, —OR*, —OC(O)CR*, —SR, —SO$_2$N(R*)$_2$, —SO$_2$R*, SOR, —OC(O)R*, —C(O)OR*, —C(O)R*, —Si(OR*)$_3$, —Si(R*)$_3$, epoxyl groups, where R* is H, an unbranched or branched, cyclic or noncyclic saturated or unsaturated alkyl or alkenyl or alkynyl groups. Here m and n are two integers. In some embodiment, m is from 1 to 6 and n is from 1 to 20.

Referring again to FIG. 10A, the carbon included group $(C)_m$ links to reaction groups Re. The reaction groups Re contain H, OH, halide, or aromatic carbon ring, or straight or cyclic alkyl, alkoxyl, fluoroalkyl, fluoroalkoxyl, alkene, alkyne, hydroxyl, ketone, aldehyde, carbonate, carboxylic acid, ester, ether, amide, amine, imine, imide, azide, nitrate, nitrile, nitrite or thiol spacer group with the chain carbon 1~12.

The second spacer group $R_{f2}$ and the reaction groups Re may also contain —Cl, —Br, —I, —NO$_2$, —SO$_3$—, —H—, —CN, —NCO, —OCN, —CO$_2$—, —OH, —OR*, —OC(O)CR*, —SR, —SO$_2$N(R*)$_2$, —SO$_2$R*, SOR, —OC(O)R*, —C(O)OR*, —C(O)R*, —Si(OR*)$_3$, —Si(R*)$_3$, epoxyl groups, where R* is H, an unbranched or branched, cyclic or noncyclic saturated or unsaturated alkyl or alkenyl or alkynyl groups.

The smoothing agent 1300 may have another chemical structure shown in FIG. 10B, which includes the second spacer group $R_{f2}$ links to an aromatic included Ar in between the brackets. The Ar group may include an unsaturated hydrocarbon with the carbon number ranges from 2~16. The Ar group links to reaction groups Re.

The smoothing agent 1300 may also have another chemical structure shown in FIG. 10C, which includes the second spacer group $R_{f2}$ links to the carbon included group $(C)_m$ and the reaction group Re in between the brackets. The reaction group Re in between the brackets coupled with polar groups P. The carbon included group $(C)_m$ links to two another reaction groups Re.

The smoothing agent 1300 may also have another chemical structure shown in FIG. 10D, which includes the second spacer group $R_{f2}$ links to the Ar group and the reaction group Re in between the brackets. The reaction group Re, in between the brackets, links to two polar groups P. The Ar group links to two another reaction groups Re. Additional steps may be implemented before, during, and after the method 1000, and some steps described above may be replaced or eliminated for other embodiments of the method 1000. For example, after step 1008, a curing process is applied to the photoresist feature 1200 to enhance smoothening effect. The curing process may include an ultraviolet (UV) curing, a plasma curing, a radiation curing, baking, or any proper process. For example, after step 1008, another step in method 1000 can include performing a second developing process is applied to enhance smoothening effect.

Based on the above, the present disclosure offers methods for lithography process. The methods employ applying a hardening treatment to a photoresist layer and an adjustable smoothening treatment to the photoresist feature. The methods demonstrate reducing of LWR, photoresist feature collapsing and film loss. The adjustable smoothening treatment achieves smoothing sidewall profile of the photoresist feature while strengthening photoresist mechanical property as well.

The present disclosure relates to a method of making a semiconductor device. The method includes exposing a photoresist layer to a radiation source and applying a hardening agent to the photoresist layer. Therefore after applying the hardening agent a first portion of the photoresist layer has a higher glass transition temperature, or a higher mechanical strength, than a second portion of the photoresist layer.

Another method of making a semiconductor device includes exposing a photoresist layer to a radiation source, developing the photoresist layer to form a feature, applying a hardening agent to the feature, wherein the hardening agent increases the glass transition temperature of the feature and applying a smoothing agent to the feature, wherein the smoothing agent reduces the glass transition temperature of the feature.

A material used in photolithography process includes a material having a molecular weight ranging between about 150 Daltons and about 3000 Daltons. The material includes a spacer group $R_f$, a carbon included group and reaction groups, or a spacer $R_f$, an aromatic included group and reaction groups, or a spacer group $R_f$, a carbon included group, polar groups and reaction groups, or a spacer group $R_f$, a aromatic included group, polar groups and reaction groups.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method comprising:
   exposing a photoresist layer to a radiation source; and
   developing the photoresist layer to form a patterned photoresist layer, wherein the developing includes applying a developing solution that comprises a hardening agent, and wherein the developing results in a first portion of the photoresist layer having a higher glass transition temperature (Tg) or a higher mechanical strength than a second portion of the photoresist layer.

2. The method of claim 1, wherein the first portion includes a top portion of the photoresist layer and the second portion includes a bottom portion of the photoresist layer positioned directly under the top portion of the photoresist layer.

3. The method of claim 2, wherein the hardening agent comprises a chemical structure as:

wherein $R_f$ represents a spacer group L represents a link group, and z represents an integer, which is at least two,
wherein $R_f$ is selected from the group consisting of aromatic carbon ring, straight or cyclic alkyl, alkoxyl, fluoroalkyl, fluoroalkoxyl, alkene, alkyne, hydroxyl, ketone, aldehyde, carbonate, carboxylic acid, ester, ether, amide, amine, imine, imide, azide, nitrate, nitrile, nitrite, and thiol spacer group, each having a chain of 1 to 12 carbon atoms, and
wherein L is selected from the group consisting of —NH$_2$, —OH, —SH, —COOH, —COH, —COOR, —OCOR, —COR, anhydride, epoxy group, R'OR, R'OOR, R'OSOOR, and —RX, wherein R' is H, an unbranched or branched, cyclic or noncyclic, saturated or unsaturated alkyl or alkenyl or alkynyl group, and X is a halide.

4. The method of claim 2, the hardening agent is selected from the group consisting of anthracene-1, 8-dicarboxylic acid, di-ethanolamine, and acetone-1, 3-dicarboxylic acid, ethylenediamine, and NHR1R2, wherein R1 and R2 each includes H, alkyl, alkyne, alkyl, alkoxyl, fluoroalkyl, fluoroalkoxyl, alkene, alkyne, hydroxyl, ketone, aldehyde, carbonate, carboxylic acid, ester, ether, amide, amine, imine, imide, azide, nitrate, nitrile, or nitrite.

5. The method of claim 1, wherein the hardening agent comprises a chemical structure as:

herein $R_f$ represents a spacer group, P represents a polar group, and y represents an integer, which is at least two,
wherein $R_f$ is selected from the group consisting of aromatic carbon ring, straight or cyclic alkyl, alkoxyl, fluoroalkyl, fluoroalkoxyl, alkene, alkyne, hydroxyl, ketone, aldehyde, carbonate, carboxylic acid, ester, ether, amide, amine, imine, imide, azide, nitrate, nitrile, nitrite, and thiol spacer group, each having a chain of 1 to 12 carbon atoms, and
wherein the P is selected from the group consisting of —Cl, —Br, —I, —NO$_2$, —SO$_3$—, —H, —CN, —NCO, —OCN, —CO$_2$—, —OH, —OR*, —OC(O)CR*, —SR, —SO$_2$N(R*)$_2$, —SO$_2$R*, —SOR, —OC(O)R*, —C(O)OR*, —C(O)R*, —Si(OR*)$_3$, —Si(R*)$_3$, and epoxyl groups, wherein R* is H, an unbranched or branched, cyclic or noncyclic saturated or unsaturated alkyl or alkenyl or alkynyl group.

6. A method comprising:
exposing a photoresist layer to a radiation source;
developing the photoresist layer to form a feature;
applying a hardening agent to the feature, wherein the hardening agent increases a glass transition temperature (Tg) or mechanical strength of the feature; and
applying a smoothing agent to the feature, wherein the smoothing agent reduces the glass transition temperature of the feature.

7. The method of claim 6, wherein the feature has a first cross-sectional profile shape prior to applying the smoothing agent and the hardening agent, and
wherein the feature has a second cross-sectional profile shape after applying the smoothing agent and the hardening agent, the second cross-sectional profile shape being different than the first cross-sectional profile shape.

8. The method of claim 7, wherein applying the hardening agent is performed prior to applying the smoothing agent to the feature.

9. The method of claim 7, wherein applying the hardening agent and applying the smoothing agent are performed together.

10. The method of claim 6, wherein after applying the hardening agent and the smoothing agent, a resultant Tg of the feature is decreased.

11. The method of claim 6, wherein the smoothing agent comprises a chemical structure as:

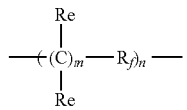

wherein $R_f$ represents a first spacer group, C represents a carbon-included group, Re represents a second spacer group, m represents an integer from 1 to 6, and n represents an integer from 1 to 20,
wherein $R_f$ is selected from the group consisting of aromatic carbon ring, straight or cyclic alkyl, alkoxyl, fluoroalkyl, or fluoroalkoxyl chain having 1 to 4 carbon atoms, straight or cyclic alkene, alkyne, hydroxyl, ketone, aldehyde, carbonate, carboxylic acid, ester, ether, amide, amine, imine, imide, azide, nitrate, nitrile, nitrite, thiol spacer group, each having a chain of 1 to 4 carbon atoms, —Cl, —Br, —I, —NO$_2$, —SO$_3$—, —H, —CN, —NCO, —OCN, —CO$_2$—, —OH, —OR*, —OC(O)CR*, —SR, —SO$_2$N(R*)$_2$, —SO$_2$R*, —SOR, —OC(O)R*, —C(O)OR*, —C(O)R*, —Si(OR*)$_3$, —Si(R*)$_3$, and epoxyl groups, wherein R* is H, an unbranched or branched, cyclic or noncyclic, saturated or unsaturated alkyl or alkenyl or alkynyl group, and
wherein Re is selected from the group consisting of H, OH, halide, aromatic carbon ring, straight or cyclic alkyl, alkoxyl, fluoroalkyl, fluoroalkoxyl, alkene, alkyne, hydroxyl, ketone, aldehyde, carbonate, carboxylic acid, ester, ether, amide, amine, imine, imide, azide, nitrate, nitrile, nitrite, thiol spacer group, each having a chain of 1 to 12 carbon atoms, —Cl, —Br, —I, —NO$_2$, —SO$_3$—, —H, —CN, —NCO, —OCN, —CO$_2$—, —OH, —OR*, —OC(O)CR*, —SR, —SO$_2$N(R*)$_2$, —SO$_2$R*, —SOR, —OC(O)R*, —C(O)OR*, —C(O)R*, —Si(OR*)$_3$, —Si(R*)$_3$, and epoxyl groups, wherein R* is H, an unbranched or branched, cyclic or noncyclic, saturated or unsaturated alkyl or alkenyl or alkynyl group.

12. The method of claim 6, wherein the smoothing agent comprises a chemical structure as:

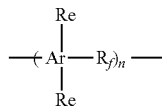

wherein $R_f$ represents a first spacer group, Ar represents an aromatic included group, Re represents a second spacer group, and n represents an integer from 1 to 20,
wherein $R_f$ is selected from the group consisting of aromatic carbon ring, straight or cyclic alkyl, alkoxyl, fluoroalkyl, or fluoroalkoxyl chain having 1 to 4 carbon atoms, straight or cyclic alkene, alkyne, hydroxyl, ketone, aldehyde, carbonate, carboxylic acid, ester, ether, amide, amine, imine, imide, azide, nitrate, nitrile, nitrite, thiol spacer group, each having a chain of 1 to 4 carbon atoms, —Cl, —Br, —I, —$NO_2$, —$SO_3$—, —H, —CN, —NCO, —OCN, —$CO_2$—, —OH, —OR*, —OC(O)CR*, —SR, —$SO_2N(R^*)_2$, —$SO_2R^*$, —SOR, —OC(O)R*, —C(O)OR*, —C(O)R*, —Si(OR*)$_3$, —Si(R*)$_3$, and epoxyl groups, wherein R* is H, an unbranched or branched, cyclic or noncyclic, saturated or unsaturated alkyl or alkenyl or alkynyl group, wherein Ar comprises an unsaturated hydrocarbon with a carbon number that ranges from 2 to 16, and wherein Re is selected from the group consisting of H, OH, halide, or aromatic carbon ring, straight or cyclic alkyl, alkoxyl, fluoroalkyl, fluoroalkoxyl, alkene, alkyne, hydroxyl, ketone, aldehyde, carbonate, carboxylic acid, ester, ether, amide, amine, imine, imide, azide, nitrate, nitrile, nitrite, thiol spacer group, each having a chain of 1 to 12 carbon atoms, —Cl, —Br, —I, —$NO_2$, —$SO_3$—, —H, —CN, —NCO, —OCN, —$CO_2$—, —OH, —OR*, —OC(O)CR*, —SR, —$SO_2N(R^*)_2$, —$SO_2R^*$, —SOR, —OC(O)R*, —C(O)OR*, —C(O)R*, —Si(OR*)$_3$, —Si(R*)$_3$, and epoxyl groups, wherein R* is H, an unbranched or branched, cyclic or noncyclic, saturated or unsaturated alkyl or alkenyl or alkynyl group.

13. The method of claim 6, wherein the smoothing agent comprises a chemical structure as:

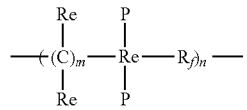

wherein $R_f$ represents a first spacer group C represents a carbon-included group, Re represents a second spacer group, P represents a polar group, m represents an integer from 1 to 6, and n represents an integer from 1 to 20, wherein $R_f$ is selected from the group consisting of aromatic carbon ring, straight or cyclic alkyl, alkoxyl, fluoroalkyl, or fluoroalkoxyl chain having 1 to 4 carbon atoms or straight or cyclic alkene, alkyne, hydroxyl, ketone, aldehyde, carbonate, carboxylic acid, ester, ether, amide, amine, imine, imide, azide, nitrate, nitrite, thiol spacer group, each having a chain of 1 to 4 carbon atoms, —Cl, —Br, —I, —$NO_2$, —$SO_3$—, —H, —CN, —NCO, —OCN, —$CO_2$—, —OH, —OR*, —OC(O)CR*, —SR, —$SO_2N(R^*)_2$, —$SO_2R^*$, —SOR, —OC(O)R*, —C(O)OR*, —C(O)R*, —Si(OR*)$_3$, —Si(R*)$_3$, and epoxyl groups, wherein R* is H, an unbranched or branched, cyclic or noncyclic, saturated or unsaturated alkyl or alkenyl or alkynyl group, wherein Re is selected from the group consisting of H, OH, halide, aromatic carbon ring, straight or cyclic alkyl, alkoxyl, fluoroalkyl, fluoroalkoxyl, alkene, alkyne, hydroxyl, ketone, aldehyde, carbonate, carboxylic acid, ester, ether, amide, amine, imine, imide, azide, nitrate, nitrile, nitrite, thiol spacer group, each having a chain of 1 to 12 carbon atoms, —Cl, —Br, —I, —$NO_2$, —$SO_3$—, —H, —CN, —NCO, —OCN, —$CO_2$—, —OH, —OR*, —OC(O)CR*, —SR, —$SO_2N(R^*)_2$, —$SO_2R^*$, —SOR, —OC(O)R*, —C(O)OR*, —C(O)R*, —Si(OR*)$_3$, —Si(R*)$_3$, and epoxyl groups, wherein R* is H, an unbranched or branched, cyclic or noncyclic saturated or unsaturated alkyl or alkenyl or alkynyl group; and wherein P is selected from the group consisting of —Cl, —Br, —I, —$NO_2$, —$SO_3$—, —H, —CN, —NCO, —OCN, —$CO_2$—, —OH, —OR*, —OC(O)CR*, —SR, —$SO_2N(R^*)_2$, —$SO_2R^*$, —SOR, —OC(O)R*, —C(O)OR*, —C(O)R*, —Si(OR*)$_3$, —Si(R*)$_3$, and epoxyl groups, wherein R* is H, an unbranched or branched, cyclic or noncyclic saturated or unsaturated alkyl or alkenyl or alkynyl group.

14. The method of claim 6, wherein the smoothing agent comprises a chemical structure as:

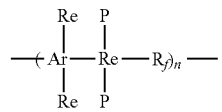

wherein $R_f$ represents a first spacer group, Ar represents an aromatic included group, Re represents a second spacer group, P represents a polar group, and n represents an integer from 1 to 20, wherein $R_f$ is selected from the group consisting of aromatic carbon ring, straight or cyclic alkyl, alkoxyl, fluoroalkyl, or fluoroalkoxyl chain having 1 to 4 carbon atoms, straight or cyclic alkene, alkyne, hydroxyl, ketone, aldehyde, carbonate, carboxylic acid, ester, ether, amide, amine, imine, imide, azide, nitrate, nitrile, nitrite, thiol spacer group, each having a chain of 1 to 4 carbon atoms, —Cl, —Br, —I, —$NO_2$, —$SO_3$—, —H, —CN, —NCO, —OCN, —$CO_2$—, —OH, —OR*, —OC(O)CR*, —SR, —$SO_2N(R^*)_2$, —$SO_2R^*$, —SOR, —OC(O)R*, —C(O)OR*, —C(O)R*, —Si(OR*)$_3$, —Si(R*)$_3$, and epoxyl groups, wherein R* is H, an unbranched or branched, cyclic or noncyclic, saturated or unsaturated alkyl or alkenyl or alkynyl group, wherein Ar comprises an unsaturated hydrocarbon with a carbon number that ranges from 2 to 16, wherein Re is selected from the group consisting of H, OH, halide, or aromatic carbon ring, or straight or cyclic alkyl, alkoxyl, fluoroalkyl, fluoroalkoxyl, alkene, alkyne, hydroxyl, ketone, aldehyde, carbonate, carboxylic acid, ester, ether, amide, amine, imine, imide, azide, nitrate, nitrile, nitrite, thiol spacer group, each having a chain of 1 to 12 carbon atoms, —Cl, —Br, —I, —$NO_2$, —$SO_3$—, —H, —CN, —NCO, —OCN, —$CO_2$—, —OH, —OR*, —OC(O)CR*, —SR, —$SO_2N(R^*)_2$, —$SO_2R^*$, —SOR, —OC(O)R*, —C(O)OR*, —C(O)R*, —Si(OR*)$_3$, —Si(R*)$_3$, and epoxyl groups, wherein R* is H, an unbranched or branched, cyclic or noncyclic saturated or unsaturated alkyl or alkenyl or alkynyl group; and wherein P is selected from the group consisting of —Cl, —Br, —I, —$NO_2$, —$SO_3$—, —H, —CN, —NCO, —OCN, —$CO_2$—, —OH, —OR*, —OC(O)CR*, —SR, —$SO_2N(R^*)_2$, —$SO_2R^*$, —SOR, —OC(O)R*, —C(O)OR*, —C(O)R*, —Si(OR*)$_3$, —Si(R*)$_3$, and epoxyl groups, wherein R* is H, an unbranched or branched, cyclic or noncyclic saturated or unsaturated alkyl or alkenyl or alkynyl group.

15. The method of claim 6, wherein the smoothing agent has a molecular weight ranging between about 150 Daltons and about 3000 Daltons.

16. A method, comprising:
 exposing a photoresist layer to a radiation source;
 applying a hardening agent and a developing solution to the photoresist layer, wherein the hardening agent increases mechanical strength of the photoresist layer;
 developing the photoresist layer to form a feature; and
 applying a smoothing agent to the feature wherein the smoothing agent reduces a glass transition temperature of the photoresist layer forming the feature.

17. The method of claim 16, wherein the hardening agent attaches to the photoresist layer by physical adsorption and/or covalent bond formation, and wherein the hardening agent is selected from the group consisting of di-ethanolamine, acetone-1,3-dicarboxylic acid, and anthracene-1,8-dicarboxylic acid.

\* \* \* \* \*